United States Patent [19]

Grundy

[11] 4,040,121
[45] Aug. 2, 1977

[54] FAIL-SAFE PRINTED CIRCUIT BOARD CONNECTION

[75] Inventor: Reed H. Grundy, Murrysville, Pa.

[73] Assignee: Westinghouse Air Brake Company, Swissvale, Pa.

[21] Appl. No.: 581,223

[22] Filed: May 27, 1975

[51] Int. Cl.² .............................................. H05K 5/00
[52] U.S. Cl. ..................................... 361/409; 361/424
[58] Field of Search ........ 317/101 CC, 101 C, 101 R; 174/68.5; 29/625, 626; 339/17 C

[56] References Cited

U.S. PATENT DOCUMENTS

| 2,886,880 | 5/1959 | Eisler | 317/101 C |
| 3,042,740 | 7/1962 | Bosworth | 339/17 C |

FOREIGN PATENT DOCUMENTS

| 550,363 | 10/1956 | Italy | 317/101 C |
| 1,055,202 | 1/1967 | United Kingdom | 174/68.5 |

Primary Examiner—David Smith, Jr.
Attorney, Agent, or Firm—A. G. Williamson, Jr.; R. W. McIntire, Jr.

[57] ABSTRACT

The external lead from a critical circuit element in a circuit component of a larger apparatus is connected to a first terminal or connector pad on a printed circuit board and at a more distant point on the lead to a second connector pad. The connection to the next element of that component is made from the second pad. Any component output to the next circuit component is connected to the first pad. Thus, any high resistance in a poor solder joint appears on the safe side of the first pad connections, that is, in the circuit connections to the next element or in the output circuit.

6 Claims, 6 Drawing Figures

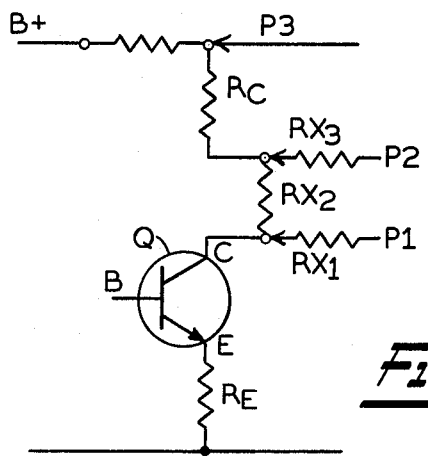
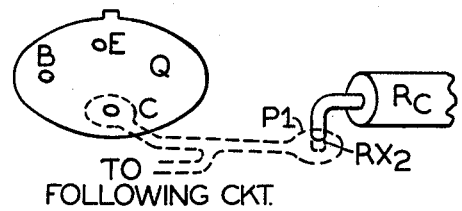
Fig.1
Fig.2
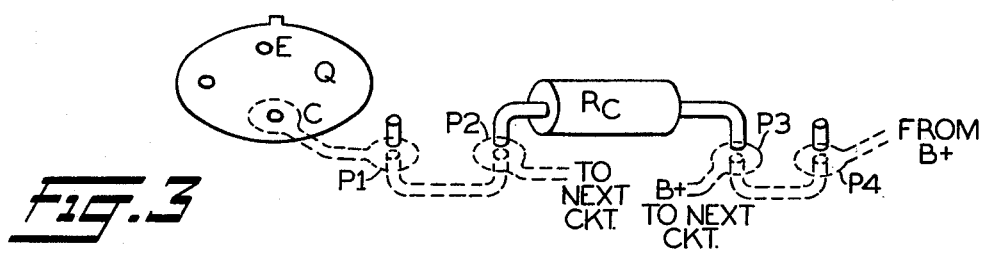
Fig.3
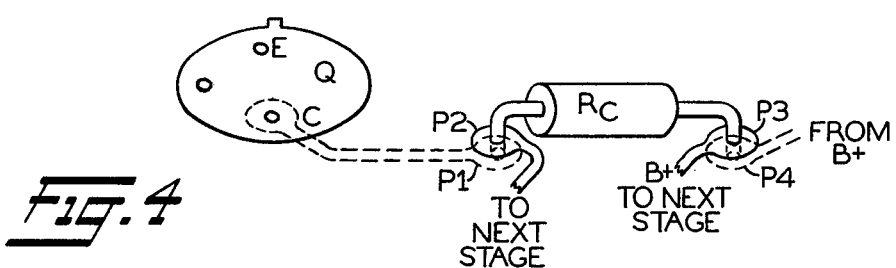
Fig.4
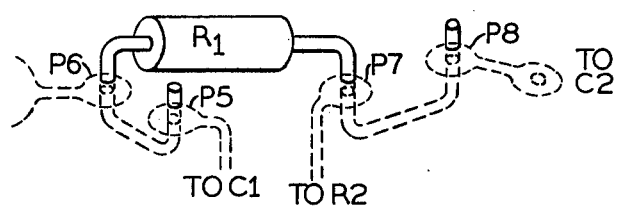
Fig.5
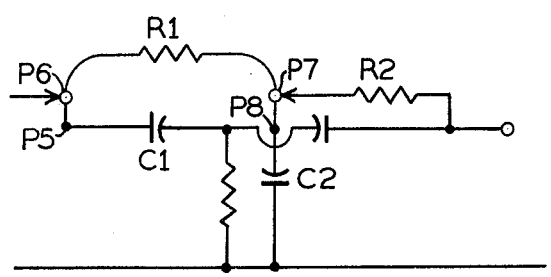
Fig.6

FAIL-SAFE PRINTED CIRCUIT BOARD CONNECTION

BACKGROUND OF THE INVENTION

My invention pertains to fail-safe type connections for a printed circuit board. More specifically, this invention pertains to the use of a Kelvin type connection between critical circuit elements on a printed circuit board to eliminate any high contact resistance from affecting the vital operation of the same or subsequent circuit network.

Vital circuit design has previously considered the probable results of an improper or fault-induced increase in the value of circuit resistance by utilizing highly reliable molded carbon resistors. In circuits where gain is fixed by the ratio of two such carbon resistors, the probability of circuit malfunction due to an increase in resistance is greatly lessened. Other circuits, such as filters, also require guarantee against resistance increase. However, a poor solder joint connecting the various circuit elements may increase the total circuit resistance and also shift the ratio in an unsafe direction. This fault condition is particularly critical in printed circuit board wiring and a fail-safe arrangement for eliminating dangerous results of such faults has been needed.

Accordingly, an object of my invention is a fail-safe printed circuit board connection.

Another object of the invention is a method of making printed circuit board connections that shifts any added resistance due to a high resistance connection to the fail-safe side of such circuit connections.

A further object of my invention is an improved method of making circuit connections on a printed circuit board by which the external lead wire of a circuit element is connected by solder joints at spaced points along its length to two connector pads on the board, with an associated circuit element of the same network connected to the more distant pad and the network output taken from the near pad, to shift any high contact or solder joint resistance in the output connection to the safe side of the common connections.

Still another object of the invention is an improved, fail-safe connection for printed circuit boards which includes a first soldered connection at a first point on a circuit element connection lead and a second soldered connection at a more distant point on that lead, and the connection to an output circuit at the first sloder connection to include any contact resistance in the output circuit.

Other objects, features, and advantages of the invention will become apparent from the following specification and appended claims taken in connection with the accompanying drawings.

SUMMARY OF THE INVENTION

In practicing the invention, the external lead of a critical circuit element in a network is connected at spaced-apart points to two separated terminal pads on the printed circuit board. Each electrical connection is made by a conventional solder joint. The circuit connection to an associated element of the same component or network is made from the outer pad. The output circuit, however, is connected from the inner pad through the usual circuit board wiring channel. This arrangement shifts any high resistance due to a poor connection or cold solder joint at the inner point on the element lead into the output circuit where the higher resistance is on the safe side. A similar connection arrangement may also be used at the B+ power bus connections, where several successive connections are used, with possibly intervening resistors to reduce potential.

DESCRIPTION OF ILLUSTRATED EMBODIMENTS

I shall now describe the illustrated embodiments of my invention, referring to the accompanying drawings in which:

FIG. 1 is a partial circuit diagram of a transistor amplifier which illustrates both the faulty operation possible with the prior art circuit board wiring arrangement and the improved operation resulting from use of circuit board connections embodying my invention.

FIG. 2 is a schematic illustration of the prior art physical connections on a printed circuit board for the critical portion of the circuit of FIG. 1.

FIG. 3 is a schematic illustration of circuit board connections of similar parts of the circuit of FIG. 1 but embodying the features of my invention.

FIG. 4 is another schematic diagram illustrating an alternate manner of making the circuit board connections shown in FIG. 3.

FIG. 5 illustrates, in schematic form, the circuit board connections embodying the invention, for the critical portion of another circuit arrangement.

FIG. 6 is a circuit diagram of the apparatus which includes the circuit board arrangement of FIG. 5.

In each of the drawing figures, similar references designate similar parts of the apparatus In the drawing figures illustrating circuit board connections, each circular symbol, shown generally by dash lines, represents an electrical terminal or connector pad, normally of copper, impressed onto the surface of the circuit board, with a central passageway through the board, designated by a small central circle, for insertion of the external wire leads of the circuit elements such as resistors and capacitors. The generally parallel dash lines extending from these connector pads represent the electrically conducting copper leads or channels impressed onto the board surface in a predetermined pattern to provide electrical connections between preselected ones of the pads. Other parallel lines, dash and solid, represent the external lead wires of circuit elements such as resistor $R_C$, FIG. 3, which lead wires are inserted through the passageways in the pads. Connection between a terminal pad and the circuit element lead inserted through the center passageway or hole is normally made by a solder joint. It is in these solder joints, if improperly made or cured, that circuit trouble occurs in the form of high resistance contact or connection.

Referring to FIG. 1, the major portion of the circuit diagram is shown for a simple amplifier arrangement including a transistor Q. The gain of this amplifier stage is established by the ratio of the collector resistor $R_C$, between points P2 and P3, divided by the emitter resistor $R_E$, i.e., $R_C/R_E$. Referring to FIG. 2, if a poor solder joint occurs where the external lead wire of resistor RC goes through the pad P1, additional resistance, designated $RX_2$, is inserted in series with resistor $R_C$. This increases the gain of the amplifier by the factor $RX_2/R_E$.

If the output signal or supply to a following circuit component or stage is connected to the collector C of transistor Q at point P1, as shown in FIG. 2, then resistance $RX_2$ causes an increase in the total gain of this amplifier stage and the output signal is too large. However, if the output is taken at point P2, as shown in FIG. 1, the contact resistance $RX_2$ is effectively added to the emitter resistor $R_E$ and the amplifier gain is reduced, which is action in the fail-safe direction.

The schematic illustration of FIG. 3 shows a method of mechanically assuring that the supply to the following circuit is taken from point or pad P2. A poor solder joint at pads P1 and/or P2 increases the resistance $RX_2$ which lowers the effective gain for the signal supplied to the following circuit. This, of course, improves the fail-safe protection of the apparatus. A similar resistance increase can occur at the B+ end of resistor $R_C$. Protection is provided, as also shown in FIG. 3, by supplying the B+ potential to the end of the external resistor lead at pad P4 and taking the B+ supply for the following circuit at pad P3.

The arrangement shown schematically in FIG. 4 is an alternate to that of FIG. 3 which allows a more simple method of fabricating the printed circuit board for a particular application. The terminal pads are topologically similar to those of FIG. 3, but pads P2 and P3 are positioned on the upper surface of the circuit board (solid lines), while the paired pads P1 and P4, respectively, are aligned on the lower surface of the board. A single passageway or hole for the circuit element lead is common to each pair but is not plated through. In other words, each pair of pads are separated and insulated by the non-conducting material of the circuit board.

An illustration of a similar physical layout to protect against an increase in the resistance element of an arm of a twin-tee filter is shown schematically in FIG. 5, with a partial circuit diagram in FIG. 6. Any high resistance in a poor solder joint at pad P6 will not add to the value of resistor R1 but rather reduce the input signal. Further, a similar high resistance contact at pad P5 will appear as additional impedance in the path including capacitor C1. Similarly, high resistance in pad P7 reduces the signal supplied to resistor R2, while resistance at pad P8 effectively appears to be in the circuit path to capacitor C2.

The fail-safe printed circuit board connections disclosed by my invention provide a simple yet effective method of eliminating improper operation of critical circuits due to high resistance contacts within the solder joint connections at terminal pads on the printed circuit boards. Although such high resistance connections are not eliminated, the resistance is added to associated circuit paths which cause any improper operation to be in the safe direction or manner. Thus, the fail-safe connections improve the safety of the operation of the apparatus, achieving this feature in an efficient yet economical manner.

Although I have herein shown and described but two arrangements of circuit board connections embodying my invention, it is to be understood that other changes and modifications may be made within the scope of the appended claims without departing from the spirit and scope of my invention.

Having thus described the invention, what I claim as new and desire to secure by Letters Patent, is:

1. On a printed circuit board, a fail-safe circuit connection arrangement comprising:

a. a first and a second terminal pad for interconnecting two circuit elements, at least one of which has external lead wire connections,
    b. a first solder joint connection between one external lead wire of said one element and said first terminal pad,
    c. a second solder joint connection between said second terminal pad and said one external lead wire at another point along that lead more distant from said one element,
    d. a circuit connection between said second terminal pad and the other circuit element for adding any resistance in said first solder joint only to said second element to maintain unchanged the established parameter values of said one element circuit path, and
    e. a circuit connection from said first terminal pad to another circuit stage for transferring an output signal between said one element and said other stage exclusive of any resistance in said first solder joint.

2. A circuit board connection arrangement as defined in claim 1 in which:

a. said one circuit element is a resistor whose selected value is critical to the safe operation of the circuit stage,
    b. said other element is a transistor whose gain depends in part on the value of said resistor element, and
    c. any solder joint resistance at said first or second pad is transferred to reduce the gain of said transistor and thus the level of the output signal.

3. A circuit board connection arrangement as defined in claim 1, in which said first and second terminal pads are spaced apart on the same surface of said board.

4. A circuit board connection arrangement as defined in claim 1, in which:

a. said first and second terminal pads are spaced vertically on opposite surfaces of said circuit board, and insulated by the material forming said board,
    b. said first and second terminal pads intersected by a common nonconducting passageway for the external lead wire of said one circuit element.

5. A circuit board connection arrangement as defined in claim 1, in which:

a. said one circuit element is a resistor whose selected value is critical to the safe operation of the circuit stage, and
    b. said first solder joint connection transfers any high contact resistance to the other element circuit path.

6. The method of making fail-safe connections on a printed circuit board comprising:

a. soldering a first connection between a first terminal pad on said board and a first point on an external lead wire of a critical first circuit element.
    b. soldering a second connection between a second terminal pad and another more distant point on said external lead wire of said first circuit element, such that said first and second terminal pads are connected by the intervening portion of said external lead wire,
    c. coupling an input to a second circuit element, next in order in a first circuit stage including said first circuit element, to said second terminal pad, and
    d. coupling a following circuit stage direct to said first pad to receive an output signal from said first circuit stage, so that any high contact resistance in either solder connection is added only to said second circuit element and reduces said output signal in a fail-safe manner.

* * * * *